United States Patent
McEwen et al.

(10) Patent No.: US 6,201,485 B1
(45) Date of Patent: Mar. 13, 2001

(54) HIGH RATE RUNLENGTH LIMITED CODES FOR 8-BIT ECC SYMBOLS

(75) Inventors: Peter McEwen, Santa Clara; Bahjat Zafar, Sunnyvale, both of CA (US); Kelly Fitzpatrick, Sudbury, MA (US)

(73) Assignee: Quantum Corp., Milpitas, CA (US)

( * ) Notice: Subject to any disclaimer, the term of this patent is extended or adjusted under 35 U.S.C. 154(b) by 0 days.

(21) Appl. No.: 09/350,767

(22) Filed: Jul. 9, 1999

(51) Int. Cl.[7] .......................... H03M 7/00; H03M 13/00; G11B 5/09
(52) U.S. Cl. ............................... 341/59; 341/94; 360/40; 714/701
(58) Field of Search .................. 341/58, 59, 94; 360/40–41, 48, 53; 375/240.27, 240.01, 240; 348/384.1, 390.1; 714/701, 755, 752

(56) References Cited

U.S. PATENT DOCUMENTS

| 5,136,436 | * | 8/1992 | Kahlman | 360/40 |
| 5,635,933 | * | 6/1997 | Fitzpatrick et al. | 341/58 |
| 5,748,119 | * | 5/1998 | Ko | 341/59 |
| 5,757,294 | * | 5/1998 | Fisher et al. | 341/57 |
| 5,757,822 | * | 5/1998 | Fisher et al. | 371/37.1 |
| 6,002,718 | * | 12/1999 | Roth | 375/240 |

* cited by examiner

*Primary Examiner*—Michael Tokar
*Assistant Examiner*—James H Cho

(57) ABSTRACT

A methodology for designing and implementing high rate RLL codes is optimized for application to 8-bit ECC symbols, and provides modulation code rates including rate 32/33; rate 48/49; rate 56/57; rate 72/73; rate 80/81 and other code rates for use in magnetic recording channels. A relatively small subcode encoding—one easy to implement—is applied to a portion of the input stream, and the resulting base codeword is partitioned into nibbles that, in turn, are interleaved among the unencoded ECC symbols. Code constraints on the subcode word nibbles depend upon the values of adjacent unencoded symbols. The resulting codes provide excellent density and error propagation performance.

20 Claims, 3 Drawing Sheets

| A | $y_0$ | B | $y_1$ | E | $y_2$ | F | $y_3$ |
|---|---|---|---|---|---|---|---|
| 8 | 4 | 8 | 5 | 8 | 4 | 8 | 4 |

Rate 48/49 codeword

FIG. 5A
Rate 32/33 codeword arrangement

| 8 | 3 | 8 | 3 | 8 | 3 |
|---|---|---|---|---|---|

FIG. 5B
Rate 48/49 codeword arrangement

| 8 | 4 | 8 | 5 | 8 | 4 | 8 | 4 |
|---|---|---|---|---|---|---|---|

FIG. 5C
Rate 56/57 codeword arrangement

| 8 | 3 | 8 | 4 | 8 | 3 | 8 | 4 | 8 | 3 |
|---|---|---|---|---|---|---|---|---|---|

FIG. 5D
Rate 72/73 codeword arrangement

| 8 | 4 | 8 | 4 | 8 | 5 | 8 | 4 | 8 | 4 | 8 | 4 |
|---|---|---|---|---|---|---|---|---|---|---|---|

FIG. 5E
Rate 80/81 codeword arrangement

| 8 | 4 | 8 | 4 | 8 | 3 | 8 | 4 | 8 | 3 | 8 | 4 | 8 | 3 |
|---|---|---|---|---|---|---|---|---|---|---|---|---|---|

HIGH RATE RUNLENGTH LIMITED CODES FOR 8-BIT ECC SYMBOLS

TECHNICAL FIELD

The present invention relates to channel modulation codes and methods for implementation in magnetic recording systems such as disk drives. More specifically, the present invention relates to high rate run-length limited (RLL) modulation codes for use in a PRML channel.

BACKGROUND OF THE INVENTION

Modulation codes are used in magnetic recording channels in order to limit recorded bit sequences to those that are most reliably detectable. In particular, run length limited (RLL) modulation codes have been used with partial response signaling, maximum likelihood detection (PRML) channels, decision feedback equalization (DFE) channels, and the like. Partial response systems of interest for magnetic data storage devices such as disk drives and magnetic tape include a PR4 $(1-D^2)$ channel and EPR4 $(1+D-D^2-D^3)$ channel as well as other nonclassical polynomials. The present invention can be used with any PR or DFE channel.

In general, magnetic recording systems employ Viterbi detectors to achieve maximum likelihood detection of user data as it is played back from the recording medium. A modulation code for a PRML data recording and playback channel is selected to balance code efficiency against timing/gain loop reliability, as well as error propagation during decoding. RLL codes limit the length of the all zeros sequence, the all ones sequence, and the Nyquist sequence . . . 0101 . . . here using the NRZ notation, which corresponds to magnetization on a disk, tape or other magnetic recording medium. In channels of current interest, these sequences contain little or no timing information necessary for proper operation of the playback system. According, codes are designed to exclude them from permissible codewords.

Run length limited modulation codes are often described using the format "(rate) RLL (d,G/I)" where the "(rate)" is expressed as a ratio of the number of input bits to be encoded to the number of output bits in the resulting codeword. (The letters G and I represent global and interleave run length constraints, respectively.) For example, a rate 8/9 modulation code converts an 8-bit input byte into a 9-bit codeword. Rate 8/9 encoding is well known in the art, as described, for example, in U.S. Pat. Nos. 4,707,681 and 5,260,703. Rate 8/9 encoding for PRML data channels also is described in U.S. Pat. No. 5,196,849. As the code rate approaches unity, the code is deemed to be more efficient, in that relatively fewer code characters are required to encode user data values. Thus, a rate 8/9 code is more efficient than a rate 2/3 code.

Similarly, a rate 16/17 code is more efficient than a rate 8/9 code. A rate 16/17 code (=0.941) achieves an approximately 6% increase in recording density over a standard rate 8/9 modulation code. One example of a rate 16/17 modulation code is described in commonly assigned U.S. Pat. No. 5,635,933 incorporated herein by this reference. Another rate 16/17 code is described in U.S. Pat. No. 5,784,010 assigned to IBM.

Early PRML read channels used the well-known rate 8/9 RLL(0,4/4) channel code. In accordance with prior art, this channel code is combined with a $1/(1 \oplus D)$ modulo 2 precoder to obtain the $\{+1,-1\}$ valued magnetic write-current pattern. On the decoder side, the signal is first equalized to the partial response target and then the $+1/-1$ write-current waveform is maximum-likelihood detected. The write current is then "unprecoded" (or postcoded) with a $1 \oplus D$ modulo 2 function. This "undoes" the precoding to regenerate a $\{0,1\}$ valued sequence. The data is then RLL decoded for the user. Examples of RLL encoders and decoders are disclosed in the patents identified above.

The rate 8/9 code can be extended to a rate 16/17 code by either bit-wise or byte-wise interleaving unencoded bytes with the encoded sequence. While the G and I constraints will become considerably larger (G=12, I=8 for byte-wise interleaved case), the roughly 6% in increased code rate is often considered worthwhile. About the highest code rate described in the literature is a rate 24/25 code described in commonly-assigned U.S. Pat. No. 5,757,294.

The need remains for improvements in recording channel encoding efficiency in order to improve storage capacities in recording systems and lower costs. More specifically, the need remains to find code constraints than can be used to obtain high-rate, runlength limited (RLL) codes with optimized error propagation and simple implementation. Moreover, such codes are often used with an outer error correcting code (ECC). To ensure reliable recovery of the data, the error propagation characteristics of the RLL code with the ECC should be minimized. The new codes described below are designed to minimize error propagation with an ECC based on 8-bit symbols. The codes described in this patent application are (0,K) codes. The K constraint is equivalent to the G constraint. The 0 here means that consecutive ones are allowed, i.e. there is no restriction on the minimum run length of zeros.

SUMMARY OF THE INVENTION

In view of the foregoing background, a general object of the present invention is to improve the effective areal density of data recorded on a magnetic media.

Another object is to improve recording efficiency by reducing the relative number of non-data bits or "overhead" in the data encoding process.

An object of the invention is to provide very high rate modulation codes having reasonable run length limitations for use in magnetic recording and playback systems.

A further object of the invention is to minimize implementation complexity in the context of high rate RLL codes, by providing a relatively small subcode.

A further object is to improve efficiency of RLL encoding of 8-bit symbols for magnetic recording.

A still further object of the invention is to provide for implementation of various modulation codes that limit error propagation in the context of 8-bit ECC symbols.

A further object of the present invention is to provide encoding schemes having improved ratios of data bits to code word length without degrading run length limiting in encoded data.

Another object of the invention is to record data on a magnetic media so as to prevent long strings of no transitions on the magnetic media thereby allowing for reliable timing and gain recovery.

According to the invention, new constraints are applied to realize codes with rates that include 32/33, 48/49, 56/57, 72/73, and 80/81. The reader can see that such codes are highly efficient; approaching unity rates.

The invention includes several codes that are particularly well suited for use with 8-bit ECC symbols. Certain codes optimized for 4-way interleaved ECC are described. These examples have rates 32/33 and 48/49, although other combinations of code rates and ECC interleaving can be obtained in accordance with the teaching of the present invention.

A still further aspect of the invention includes methodologies for reducing error propagation caused by the precoder/postcoder in a typical magnetic storage system.

According to one aspect of the invention, methodologies and constraints are disclosed to enable the creation of a variety of high rate channel codes primarily for use in a PRML channel of a magnetic recording and playback system. The new method of designing and implementing a desired code generally includes the following steps:

First, for a desired RLL code, select a suitable base code (or "subcode") having a rate n/n+1 where n is a multiple of the ECC symbol size. Thus, for 8-bit ECC symbol size, a base code could be rate 16/17 or say, 24/25.

Second, encode one or more of the ECC symbols using the selected base code. Specifically, the number of ECC symbols to be encoded is the number of symbols necessary to provide the number of input bits appropriate to the selected base code. For example, a rate 16/17 base code will require encoding two 8-bit ECC symbols, while a rate 24/25 base code will require encoding three ECC symbols (to encode 24 input bits).

Third, partition the codeword produced by the base code into a plurality of m nibbles, each of which contains at least one transition. For example, assume a rate 48/49 RLL code is desired. The base code rate 16/17 is selected, and two ECC symbols are encoded to form the 17-bit subcode word. That length 17 subcode word is partitioned into m=4 nibbles as four ECC symbols remain unencoded. In a presently preferred embodiment, the four nibbles have lengths 4, 5, 4 and 4 bits.

Next, the subcode nibbles are interleaved among the unencoded ECC symbols. The order of the unencoded symbols and the order of the subcode nibbles interleaved among them is not limited to any specific predetermined sequence. The resulting codeword can begin with either an unencoded ECC symbol or a subcode nibble. Preferably, each unencoded ECC symbol is separated from the next by a subcode nibble, but the present invention also allows for more than one unencoded symbol between two subcode nibbles.

A further code constraint calls for modifying the subcode nibbles in response to the values of corresponding unencoded symbols that will be positioned adjacent to the $x_i$ nibbles in the target codeword. Specifically, the invention forbids all zeros in a subcode nibble if the immediately preceding bit (i.e. the last bit of the preceding unencoded symbol) is a zero. Conversely, we forbid all ones in a subcode nibble if the immediately preceding bit (i.e. the last bit of the preceding unencoded symbol) is a one. These constraints ensure at least one magnetic flux transition per nibble.

For each code, many different arrangements of the unencoded symbols and encoded nibbles can be used. FIGS. 5A–5E show just one example for each code. The size and arrangements of the nibbles, however, has implications for the maximum length of uninterrupted strings of ones and zeros in the resulting codeword, as further explained later. In general, the nibbles will be similar to one another in length, if not uniform. This arises from, first, designing the base code so as to provide an adequate number of codewords. Second, the base code table is designed so as to be easy to implement. These design criteria will tend to result in codes that have good run length properties and result in nibbles that have about the same size. FIG. 5 shows some examples.

Thus in one preferred embodiment, in a rate 48/49 code, the base code has rate 16/17, the number of the unencoded ECC symbols is m=4, and the length 17 word produced by the base code encoder is divided into 4 nibbles of lengths 4,5,4 and 4. The resulting codeword consists of the four unencoded ECC symbols interleaved with the nibbles mentioned above, resulting in the following arrangement:

TABLE 1

| Rate 48/49 codeword | | | | | | | |
|---|---|---|---|---|---|---|---|
| ECC | nibble | ECC | nibble | ECC | nibble | ECC | nibble |
| 8 | 4 | 8 | 5 | 8 | 4 | 8 | 4 |

This is just an illustrative example; there are various ways of mapping the input bits to the codewords within the scope of the present invention. Further illustrations are given later.

The described techniques provide simplicity of implementation along with enviable recording density and error propagation performance. The codes described also allow use of a simple precoder $1/1 \oplus D$ to limit the length of the Nyquist sequence ( . . . 01010101 . . . ) where $\oplus$ denotes modulo-2 addition.

The run length constraints k can be reduced by imposing additional constraints on the base codeword nibbles. For example, additional patterns (besides the all ones and all zeros patterns) can be excluded. And, as noted above, the nibble lengths can be "smoothed" (i.e. variation minimized) to reduce k as well.

The present invention is quite different from other modulation coding schemes. For example, in the rate 24/25 code described in U.S. Pat. No. 5,757,294, one input symbol or byte is encoded, and the resulting codeword is partitioned and interleaved among the unencoded bytes. There, the encoded byte (rate 8/9 base code) was produced by a fixed encoding, i.e. without regard to the unencoded bytes. By contrast, according to the present invention, the nibbles first produced by the base code encoding are then subjected to modification ($x_i \rightarrow y_i$), the fifth step above, depending upon the adjacent unencoded byte (the adjacent bit). Another example of the prior art is the '933 patent, directed to a rate 16/17 encoding scheme that again depends solely on the 16-bit (2 byte) input word, without regard to neighboring (unencoded) data.

Another aspect of the invention is a high rate run length limited code designed in accordance with the foregoing principles.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 5A–5E are examples of codeword arrangements for various high rate RLL codes for 8-bit ECC symbols.

DETAILED DESCRIPTION OF PREFERRED EMBODIMENT

Figure 1:
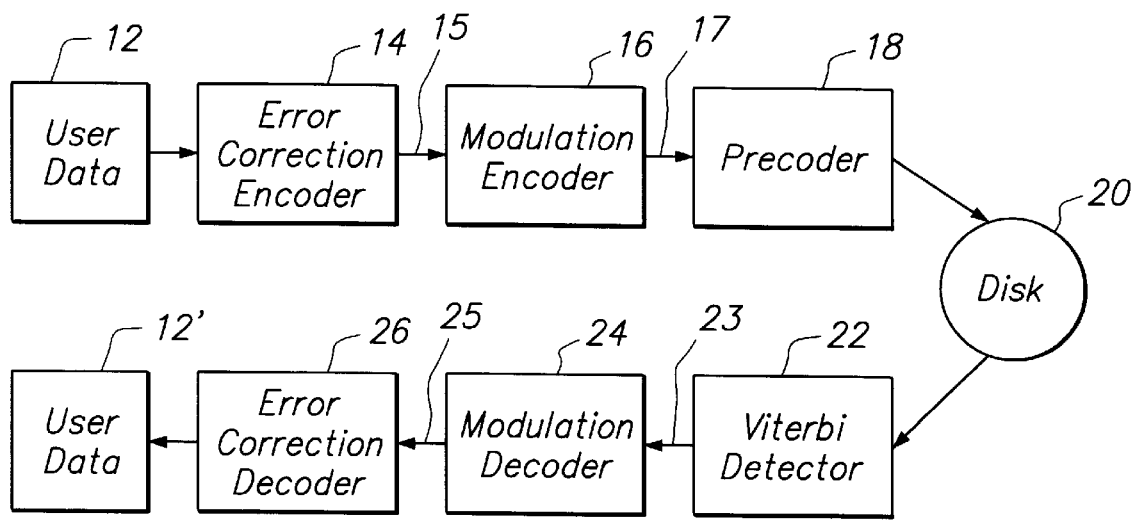
FIG. 1 is a simplified block diagram illustrating data flow in a magnetic data storage device, such as a hard disk drive, employing partial response signaling and maximum likelihood detection.

FIG. 1 sets forth a simplified block diagram of a magnetic recording and playback system such as a hard disk drive. While a hard disk drive is one application for the present invention, those skilled in the art will appreciate that the principles of this invention may be usefully applied to other devices, such as magnetic tape recording, for example. User data blocks (e.g. sectors) 12 are received from a source, such as a host computer (not shown). The blocks are passed through an error correction encoder 14 which generates and appends ECC remainder bytes to the blocks in accordance with a preestablished ECC polynomial and scheme. The error correction encoder 14 may be conventional, and it is not further described herein. Each data block (now having a predetermined number of ECC bytes appended) then passes through a modulation encoder 16. The modulation encoder 16 is in accordance with principles of the present invention, and it encodes data to form codewords as described in greater detail hereinafter. Each codeword is then passed serially through, for example, a precoder 18 having a function $1/(1 \oplus D)$. The resulting precoded codewords are then recorded as sequences of magnetic flux transitions within a data track defined on a storage surface of a magnetic recording disk 20 in the conventional manner.

During playback, flux transitions induced in a read head element are subjected to analog/digital filter-equalization processes, quantized as digital samples, and applied to a detector 22 implementing a Viterbi algorithm. The playback codeword is then demodulated in a modulation decoder 24 also in accordance with principles of the present invention explained later. Following decoding by the modulation decoder 24, each playback data block is passed through an error correction decoder 26 which checks the playback ECC bytes to locate and correct any correctable error bursts. Error corrected user data 12' is then returned to a requester, such as the host computer (not shown). If the error correction decoder determines that a data block includes uncorrectable errors, an error flag is returned to the requester, and a second attempt is made to read the data block from the disk 20.

Figure 2A:
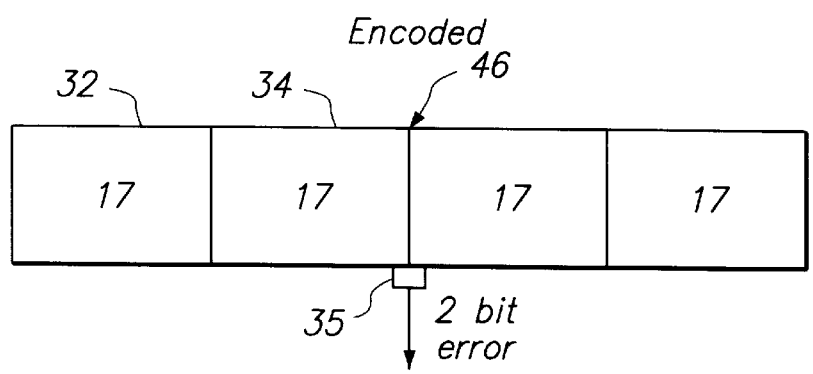
FIG. 2A illustrates a 2-bit error extending across a 17-bit codeword boundary.
Figure 2B:
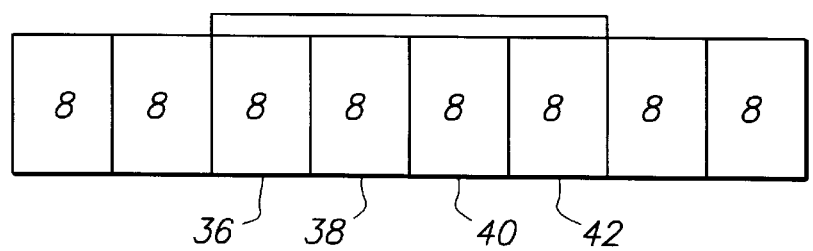
FIG. 2B illustrates the effect of the 2-bit error of FIG. 2A propagating over four bytes of user data.

Error propagation can illustrated by way of a simple example shown in FIG. 2. In FIG. 2A, a block of data consists of multiple symbols. To apply rate 16/17 encoding, the data is processed as a series of 16-bit symbols. Rate 16/17 encoding can be accomplished by encoding two 8-bit bytes into a 17-bit codeword, numbered 32, 34 etc. Where an error extends across a 17-bit codeword boundary, 46, e.g. a 2-bit error 35 as in FIG. 2A, the error therefore affects a total of four user bytes (36, 38, 40, 42) as in FIG. 2B. A primary goal of the present invention is to devise an encoding or modulation scheme that has the advantages of constrained error propagation while increasing recording density.

The codes described in this disclosure consists of m unencoded ECC symbols and a base code with rate n/n+1, where n is a multiple of the ECC symbol size (8 in this case). The length n+1 codeword produced by the base code encoder is divided into m nibbles, each of which contains at least one transition. For example, with the 48/49 code, the base code has rate 16/17, the number of the unencoded ECC symbols is m=4, and the length 17 word produced by the base code encoder is divided into 4 nibbles of lengths 4, 5, 4, and 4.

The codeword consists of unencoded ECC symbols interleaved with the nibbles mentioned above. For example, the codeword arrangement for the 48/49 code is as follows:

| 8 | 4 | 8 | 5 | 8 | 4 | 8 | 4 |
|---|---|---|---|---|---|---|---|

Next we describe how to develop code constraints in order to meet the goals of the invention. We forbid either the all zeros nibble or the all ones nibble, depending on the bit immediately preceding the nibble (the last bit of the unencoded symbol preceding the nibble). If the bit immediately preceding is '0', the all zeros nibble is forbidden and if the bit is '1', the all ones nibble is forbidden. This ensures that there will be at least one transition per nibble.

For a rate n/n+1 base code, we must have at least $2^n$ possible codewords available. With the constraint described above, there are $2^L-1$ possibilities for each length L nibble, and the number of possible base code codewords is equal to the product of the number of possibilities for each nibble. For example, with the 16/17 base code mentioned above, the number of possible base code codewords is $(2^5-1)2^4-1)^3 = 31 \cdot 15^3 = 104625$, which is greater than $2^{16} = 65536$.

Let $k_1$ be the maximum number of consecutive zeros or ones. If all nibbles have length L, then $k_1 = E + 2L - 1$, where E is the length of the ECC symbol (E=8 for the codes in this disclosure). If we have different length nibbles, then $k_1$ is determined by the two consecutive nibbles whose lengths have the largest sum. Note that in calculating $k_1$ we need to consider the concatenation of codewords, i.e., the last nibble and the first nibble should be considered as consecutive. For the 48/49 code, $k_1 = 8 + 4 + 5 - 1 = 16$. Note that these codes are RLL 0, k) codes with $k = k_1 - 1$.

The code constraint as described thus far does not limit the length of the Nyquist sequence . . . 0101 . . . . When a $1/1 \oplus D$ precoder is used, the maximum length of the Nyquist sequence is limited. The operation of this precoder is defined as follows: if the input at time j is $a_j$, then the output at time j is $b_j = b_{j-1} \oplus a_j$, where $\oplus$ denotes modulo-2 addition. With this precoder, $k_1$ (and thus k) increases by 1 and the maximum length of a Nyquist sequence is $k_1$. For the 48/49 code, $k_1 = 17$, k=16, and the maximum length of a Nyquist sequence is 17.

Table 2 below shows a summary of some code constraints that can be obtained using this approach. Other code constraints can also be obtained using this approach.

TABLE 2

Illustrative code constraints with their parameters.

| Code rate | k (no precoder) | Base code | Capacity = log (# possible codewords) |
|---|---|---|---|
| 32/33 | 12 | 8/9 | 8.4221 |
| 48/49 | 15 | 16/17 | 16.6749 |
| 56/57 | 13 | 16/17 | 16.2358 |
| 72/73 | 15 | 24/25 | 24.4886 |
| 80/81 | 14 | 24/25 | 24.0496 |

For each of the code constraints shown in Table 2, we show one possible codeword arrangement in FIGS. 5A–5E, respectively. Other arrangements of the nibbles are possible.

If the capacity is sufficient, it may be possible to reduce the k constraint by imposing additional constraints on the nibbles. This can be accomplished by forbidding additional patterns (in addition to the all zeros pattern) for one or more of the nibbles. This can also be accomplished by imposing a dependence on the encoding of consecutive nibbles. Note that since there is excess capacity for the constraints given above, there are many ways of choosing the codewords that will be used in the code. Note also that there are many ways of mapping the input bits to the codewords. All such variations are within the scope of this invention.

At the end of a sector or at the end of a portion of a split sector, it may be desirable to encode only a portion of the codeword, i.e., it may be necessary to encode a shortened codeword. For each code constraint there are many ways to accomplish this. If the base code is used in a shortened codeword, it should be used in its entirety. With any of the codes mentioned above, a subcode can be implemented by removing one or more of the unencoded symbols. For example, a 16/17 code can be obtained from the 48/49 code by removing all of the unencoded symbols.

Rate 48/49 Code

For purposes of illustrating the coding technique, here we discuss in detail a specific implementation of the rate 48/49 code. The presently preferred codeword arrangement for the 48/49 code is shown below. The encoding process is done in several steps, illustrated in a simplified diagram in FIG. 3.

| 8 | 4 | 8 | 5 | 8 | 4 | 8 | 4 |
| --- | --- | --- | --- | --- | --- | --- | --- |

Each group of six 8-bit symbols A B C D E F are encoded as follows. First, we encode C and D with a rate 16/17 code. The symbol C is separated (logically not physically) into two 4-bit nibbles C[0:3] and C[4:7] and the symbol D is separated into two 4-bit nibbles D[0:3] and D[4:7]. See step 50 in FIG. 3. Next, the encoder determines if any of these 4-bit nibbles are all zero. The logic function $f_i=1$ indicates that the corresponding nibble is all zeros. Thus the four nibble tests are defined mathematically as follows:

$$f_i = !(C[4i]+C[4i+1]+C[4i+2]+C[4i+3]), \text{ for } I=0, 1$$

$$f_{i+2} = !(D[4i]+D[4i+1]+D[4i+2]+D[4i+3]), \text{ for } I=0, 1$$

(where '+' is the logical OR operation).

Based on this information, the encoder calculates the encoded nibbles $x_0$, $x_2$, $x_3$ (4 bits each) and $x_1$ (5 bits) using the 16/17 base code Table 3 shown below. See step 60 in FIG. 3. We regard to the table below, we define a nibble $Z=Z[0:3]=0100$. This Z nibble is not needed for decoding. Note that none of the $x_i$ nibbles contains all zeros.

The Table has 16 entries or rows, corresponding to all of the possible cases of one or more of the four nibbles (from C and D symbols) having all zero values. While other base codes can be used, the one illustrated here is easy to implement and has performance advantages described later.

TABLE 3

16/17 base code encoder

| $f_0$ | $f_1$ | $f_2$ | $f_3$ | $x_0$ | $x_1$ | $x_2$ | $x_3$ |
| --- | --- | --- | --- | --- | --- | --- | --- |
| 0 | 0 | 0 | 0 | C[0:3] | 0 C[4:7] | D[0:3] | D[4:7] |
| 0 | 0 | 0 | 1 | C[0:3] | 1 $f_0$ $f_1$ $f_2$ $f_3$ | C[4:7] | D[0:3] |
| 0 | 0 | 1 | 0 | C[0:3] | 1 $f_0$ $f_1$ $f_2$ $f_3$ | C[4:7] | D[4:7] |
| 0 | 1 | 0 | 0 | C[0:3] | 1 $f_0$ $f_1$ $f_2$ $f_3$ | D[0:3] | D[4:7] |

TABLE 3-continued

16/17 base code encoder

| $f_0$ | $f_1$ | $f_2$ | $f_3$ | $x_0$ | $x_1$ | $x_2$ | $x_3$ |
| --- | --- | --- | --- | --- | --- | --- | --- |
| 1 | 0 | 0 | 0 | C[4:7] | 1 $f_0$ $f_1$ $f_2$ $f_3$ | D[0:3] | D[4:7] |
| 0 | 0 | 1 | 1 | C[0:3] | 1 $f_0$ $f_1$ $f_2$ $f_3$ | C[4:7] | Z |
| 0 | 1 | 0 | 1 | C[0:3] | 1 $f_0$ $f_1$ $f_2$ $f_3$ | D[0:3] | Z |
| 1 | 0 | 0 | 1 | C[4:7] | 1 $f_0$ $f_1$ $f_2$ $f_3$ | D[0:3] | Z |
| 0 | 1 | 1 | 0 | C[0:3] | 1 $f_0$ $f_1$ $f_2$ $f_3$ | Z | D[4:7] |
| 1 | 0 | 1 | 0 | C[4:7] | 1 $f_0$ $f_1$ $f_2$ $f_3$ | Z | D[4:7] |
| 1 | 1 | 0 | 0 | Z | 1 $f_0$ $f_1$ $f_2$ $f_3$ | D[0:3] | D[4:7] |
| 0 | 1 | 1 | 1 | C[0:3] | 1 $f_0$ $f_1$ $f_2$ $f_3$ | Z | Z |
| 1 | 0 | 1 | 1 | C[4:7] | 1 $f_0$ $f_1$ $f_2$ $f_3$ | Z | Z |
| 1 | 1 | 0 | 1 | Z | 1 $f_0$ $f_1$ $f_2$ $f_3$ | D[0:3] | Z |
| 1 | 1 | 1 | 0 | Z | 1 $f_0$ $f_1$ $f_2$ $f_3$ | Z | D[4:7] |
| 1 | 1 | 1 | 1 | Z | 1 $f_0$ $f_1$ $f_2$ $f_3$ | Z | Z |

The final encoding step proceeds as follows. If any nibble $x_i$ is all ones and the bit immediately preceding the nibble is one, $y_i$ is the complement of $x_i$, i.e., $y_i$ is all zeros; otherwise $y_i = x_i$. In mathematical terms:

Final Encoding Step

Let A[0:7], B[0:7], E[0:7] and F[0:7] be the uncoded symbols.

Figures 3, 4:
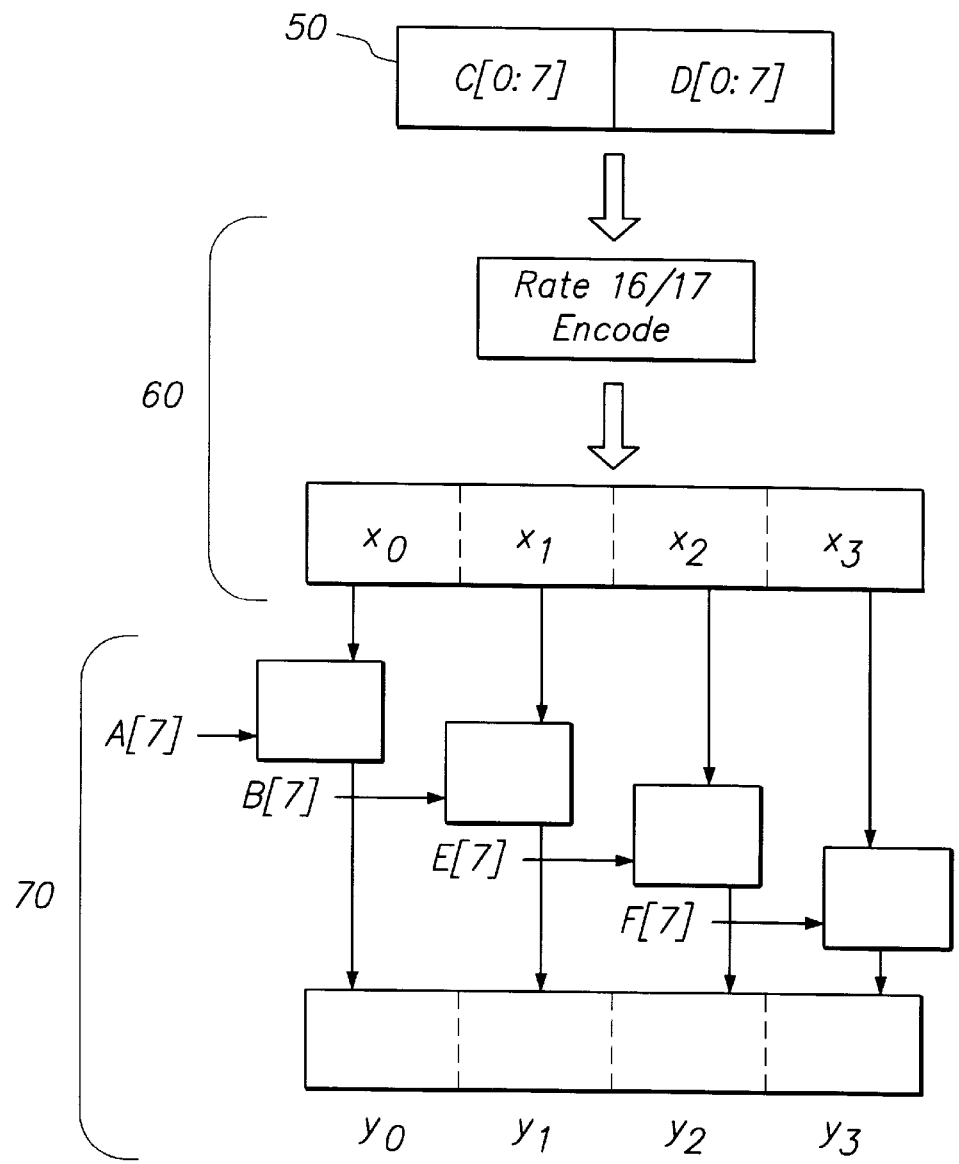
FIG. 3 is a simplified diagram of a high rate RLL modulation encoding process according to the present invention.
FIG. 4 shows a preferred arrangement of a rate 48/49 codeword.

If $x_0$=1111 and A[7]=1, then $y_0$=0000, else $y_0$=$x_0$
If $x_1$=11111 and B[7]=1, then $y_1$=00000, else $y_1$=$x_1$
If $x_2$=1111 and E[7]=1, then $y_2$=0000, else $y_2$=$x_2$
If $x_3$=1111 and F[7]=1, then $y_3$=0000, else $y_3$=$x_3$ The final length 49 codeword is A $y_0$ B $y_1$ E $y_2$ F $y_3$ as illustrated in FIG. 4 in the drawings. The foregoing steps correspond to the modulation encoder 16 of FIG. 1. Hardware, firmware and or software for implementing this process will vary, depending on the specific application. A presently preferred embodiment will take the form of a custom IC or ASIC to achieve low unit cost, small size and high speed.

Decoding

The first decoding step is shown below. If any nibble $y_i$ is all zeros, then $x_i$ is the complement of $y_i$, i.e., $x_i$ is all ones; otherwise $x_i=y_i$. In the final decoding step we obtain C and D from $x_0$, $x_1$, $x_2$, and $x_3$ using Table 3 above.

First Decoding Step

If $y_0$=0000, then $x_0$=1111, else $x_0$=$y_0$
If $y_1$=00000, then $x_1$=11111, else $x_1$=$y_1$
If $y_2$=0000, then $x_2$=1111, else $x_2$=$y_2$
If $y_3$=0000, then $x_3$=1111, else $x_3$=$y_3$

Error Propagation Characteristics of the 48/49 Code

Interleaved ECC is normally used for disk drive applications since the length of the ECC codeword is not sufficient to cover 512 byte sector length when an 8-bit ECC is used. With a 4-way interleaved ECC, the first ECC codeword consists of sector bytes 1,5,9 . . . . The second ECC codeword consists of sector bytes 2, 6, 10 . . . and so on for the third and fourth ECC codewords. The codes described in this application are designed for low error propagation with a 4-way interleaved ECC, meaning that there is a very low probability of a single error event affecting more than one ECC symbol in the same interleave. This is accomplished by providing large separation between nibbles and uncoded symbols that correspond to different ECC symbols in the same interleave. One of the keys to achieving this can be seen by examining Table 3. If an error affects $x_0$, only one ECC symbol © will be affected, and likewise if an error affects $x_3$, only one ECC symbol (D) will be affected. This reduction of error propagation in the 16/17 base code allows an arrangement of the base code nibbles and uncoded symbols that provides good error propagation characteristics for the 48/49 code with a 4-way interleaved ECC. Table 4 shows how the uncoded symbols are mapped to the codewords. Each codeword is obtained from 6 symbols as explained above, and a 4-way interleaved ECC is assumed. Thus the mapping is periodic with period 12.

TABLE 4

Mapping of uncoded symbols to codewords for the 48/49 code

| 8 | 4 | 8 | 5 | 8 | 4 | 8 | 4 | 8 | 4 | 8 | 5 | 8 | 4 | 8 | 4 |
|---|---|---|---|---|---|---|---|---|---|---|---|---|---|---|---|
| $A_1$ | $C_1$ | $B_1$ | $C_1$ $D_1$ | $E_1$ | $C_1$ $D_1$ | $F_1$ | $D_1$ | $A_2$ | $C_2$ | $B_2$ | $C_2$ $D_2$ | $E_2$ | $C_2$ $D_2$ | $F_2$ | $D_2$ |
| $U_1^1$ | $U_3^3$ | $U_2^2$ | $U_3^3$ | $U_5^1$ | $U_3^3$ | $U_6^2$ | $U_4^4$ | $U_7^3$ | $U_9^1$ | $U_8^4$ | $U_9^1$ | $U_{11}^3$ | $U_9^1$ | $U_{12}^4$ | $U_{10}^2$ |
|   |   |   | $U_4^4$ |   | $U_4^4$ |   |   |   |   |   | $U_{10}^2$ |   | $U_{10}^2$ |   |   |

The first two rows of Table 4 are as explained above except that: (a) the subscript 1 or 2 is used to indicate the first or second group of 6 symbols, and (b) the assignment of symbols to nibbles is made such that all symbols that could be affected by an error in a nibble are assigned to that nibble. The last row of table 4 is provided to illustrate the error propagation characteristics. Each uncoded symbol or nibble has assigned to it a label $U_i^j$ corresponding to the symbol that would be affected by an error in that uncoded symbol or nibble. A symbol $U_i^j$ is the ith symbol within each group of 12 and belongs to the jth interleave. It can be seen from table 2 that for each of the 4 interleaves, the separation between two symbols in the same interleave is 12, 17, and 24. Thus with no postcoder, an error event must have at least length 14 in order to affect two symbols in the same interleave. With the 1⊕D postcoder, the length must be at least 13.

Error Propagation Characteristics of the 32/33 Code

For purposes of illustration, with the 32/33 constraint we show in Table 5 a specific mapping of the uncoded symbols to the codewords. This mapping provides good error propagation characteristics with a 4-way interleaved ECC. This mapping is periodic with period 16. Shorter periods do not provide comparable error propagation characteristics.

disclosure also have low implementation complexity, which has been achieved primarily by using a small subcode as a base code. The approach described in this disclosure minimizes error propagation, i.e., a typical error event causes a small number of ECC symbol errors. This is because many of the ECC symbols are uncoded and the number of boundaries between sections in the codeword that correspond to different ECC symbols is minimized. Note that this requires that the code be designed specifically for 8-bit ECC symbols.

With an interleaved ECC, the best performance with respect to error propagation is obtained by minimizing the probability that a single error event affects more than one ECC symbol on the same interleave. The 48/49 code example given in this disclosure was designed for a 4-way interleaved ECC. With this code and ECC, any error event that has length less than 13 bits will affect only one symbol on any of the interleaves. Typically, the vast majority of error events are substantially shorter than 13. Compare this with a 48/49 block code (where the entire block is encoded and decoded together); here error event will typically cause 6 or 12 ECC symbol errors, and 2 or 3 ECC symbols on each interleave. For the 48/49 code example given in this disclosure, if the length of the error event is 5 or less (which is the case for most error events), the total number of ECC symbol errors (without regard to interleaving) will almost always be one, occasionally be two, and will never be three.

As described above, for each nibble we forbid either the all zeros nibble or the all ones nibble, depending on the bit immediately preceding the nibble). If the bit immediately preceding is '0', the all zeros nibble is forbidden and if the

TABLE 5

Mapping of uncoded symbols to codewords for the 32/33 code

| 8 | 3 | 8 | 3 | 8 | 3 | 8 | 3 | 8 | 3 | 8 | 3 | 8 | 3 | 8 | 3 | 8 | 3 | 8 | 3 | 8 | 3 |
|---|---|---|---|---|---|---|---|---|---|---|---|---|---|---|---|---|---|---|---|---|---|
| $A_1$ | $D_1$ | $B_1$ | $D_1$ | $C_1$ | $D_1$ | $B_2$ | $A_2$ | $C_2$ | $A_2$ | $D_2$ | $A_2$ | $C_3$ | $B_3$ | $B_3$ | $D_3$ | $A_3$ | $B_3$ | $D_4$ | $C_4$ | $A_4$ | $C_4$ | $B_4$ | $C_4$ |
| 1 | 4 | 2 | 4 | 3 | 4 | 2 | 1 | 3 | 1 | 4 | 1 | 3 | 2 | 4 | 2 | 1 | 2 | 4 | 3 | 1 | 3 | 2 | 3 |
| 1 | 4 | 2 | 4 | 3 | 4 | 6 | 5 | 7 | 5 | 8 | 5 | 11 | 10 | 12 | 10 | 9 | 10 | 16 | 15 | 13 | 15 | 14 | 15 |

In Table 5, the third and fourth rows are similar to the third row of Table 3 (separated here for more clarity). The third row represents the js and the fourth row represents the is in the $U_i^j$ notation. It can be seen from Table 4 that for each of the 4 interleaves, the separation between two symbols in the same interleave is 14, 14, 22, and 33. Thus with no postcoder, an error event must have at least length 16 in order to affect two symbols in the same interleave. With the 1⊕D postcoder, the length must be at least 15.

Most of the codes described in this disclosure have very high code rates. The high code rates allow more efficient storage of data on the disk. The codes described in this bit is '1', the all ones nibble is forbidden. This limits the lengths of both the all zeros pattern and the all ones pattern. This contrasts with the approach that has previously been described in patents and other literature, where only the length of the all zero pattern was limited.

With the approach described in this disclosure, if we want to limit the lengths of the all zeros and all ones patterns, no preceding is required. With the previous approach, in order to accomplish the same thing, a 1/1⊕D precoder is required. If in addition we want to limit the length of the Nyquist sequence, a 1/1⊕D precoder is required with the approach described in this disclosure, while with the previous approach a $1/1 \oplus D^2$ precoder is required.

The significance of this difference relates to error propagation and can be explained as follows. When a precoder is used after the encoder, a postcoder, which is the inverse of the precoder, is required before the decoder. A $1 \oplus D$ postcoder increases the error event length by one, while a $1 \oplus D^2$ postcoder increases it by two. Shorter error events cause less error propagation, thus in both of the cases described in the previous paragraph, the approach described in this disclosure has an advantage compared to the prior approach.

If capacity is sufficient, the k constraint might be reduced by imposing additional constraints on the nibbles. This can be done by forbidding additional patterns (other than the all-zero and all-one patterns) for one or more of the nibbles. This can also be done by imposing a dependence on the encoding of consecutive nibbles. Since there is excess capacity for the constraints given above, there are many ways of choosing codewords that will be used in the code. In other words, there are many ways of mapping the input bits to the codewords.

It will be obvious to those having skill in the art that many changes may be made to the details of the above-described embodiment of this invention without departing from the underlying principles thereof. The scope of the present invention should, therefore, be determined only by the following claims.

What is claimed is:

1. A method of encoding an input block of digital data consisting of a series of 8-bit ECC symbols, the method comprising the steps of:
   selecting a base code having a rate n/n+1 where n is a multiple of the 8-bit input symbol size;
   encoding at least one of the input symbols in accordance with the selected base code so as to produce a base codeword, said encoding step including disallowing an all-zeros nibble, and the number of input symbols thus encoded being equal to a number of input symbols necessary to aggregate n input bits corresponding to the selected base code;
   partitioning the base codeword produced by the base code into a plurality of m nibbles, where m is the number of unencoded input symbols; and
   interleaving the base code nibbles among the unencoded input symbols so as to form a rate p/p+1 codeword, where p=length of the input block.

2. A method according to claim 1 wherein the input block size is 48 bits, consisting of six 8-bit input symbols.

3. A method according to claim 1 wherein the selected base code has a rate 16/17.

4. A method according to claim 1 wherein the selected base code has a rate 24/25.

5. A method according to claim 1 wherein the base code has rate 16/17 and further comprising, for each base code nibble in the p/p+1 codeword, if the last bit of the preceding unencoded symbol is a one and the base code nibble is all ones, complementing the base code nibble, thereby limiting a run length of consecutive ones in the resulting codeword.

6. A method of rate 48/49 RLL encoding a 48-bit input sequence comprising the steps of:
   receiving a series of six 8-bit input symbols;
   selecting two of the series of input symbols for rate 16/17 subcode encoding;
   leaving the four non-selected 8-bit input symbols unencoded;
   rate 16/17 encoding the selected two of the input symbols so as to form a 17-bit base codeword consisting of a series of four nibbles, each nibble containing at least one transition; and
   interleaving the four nibbles among the four unencoded 8-bit input symbols, to form a 49-bit codeword.

7. A method according to claim 6 wherein said selecting step comprises selecting an adjacent two of the series of six 8-bit input symbols for the rate 16/17 encoding step.

8. A method according to claim 6 wherein said interleaving step includes:
   inserting a first one of the series of nibbles following the first unencoded 8-bit input symbol;
   inserting a second one of the series of nibbles following the second unencoded 8-bit input symbol;
   inserting a third one of the series of nibbles following the third unencoded 8-bit input symbol; and
   inserting the fourth one of the series of nibbles following the fourth unencoded 8-bit input symbol, wherein the first, second, third and fourth nibbles are arbitrarily selected among the four nibbles of the 17-bit subcode word.

9. A method according to claim 6 wherein said interleaving step includes:
   inserting a first one of the series of nibbles before the first unencoded 8-bit input symbol;
   inserting a second one of the series of nibbles before the second unencoded 8-bit input symbol;
   inserting a third one of the series of nibbles before the third unencoded 8-bit input symbol; and
   inserting the fourth one of the series of nibbles before the fourth unencoded 8-bit input symbol, wherein the first, second, third and fourth nibbles are arbitrarily selected among the four nibbles of the 17-bit subcode word.

10. A method according to claim 6 wherein three of the four nibbles formed by the rate 16/17 encoding step have four bits each, and the fourth one of the four nibbles has five bits.

11. A method according to claim 6 wherein said rate 16/17 encoding step includes:
   arranging two of the selected 8-bit symbols so as to form a series of four input nibbles defined as C[0:3], C[4:7], D[0:3] and D[4:7], where C and D are the input symbols selected for rate 16/17 encoding;
   calculating a series of four encoded nibbles, $x_0$, $x_1$, $x_2$ and $x_3$ responsive to the four input nibbles, such that none of the encoded nibbles $x_i$ consists of all zeros;
   for each encoded nibble $x_i$ determined to consist of all ones, if the bit immediately preceding the nibble is a logic one, complementing the said nibble $x_i$ to form a corresponding encoded nibble $y_i$ where $y_i$ consists of all zeros; and
   for each encoded nibble determined not to consist of all ones, forming a corresponding encoded nibble $y_i=x_i$; thereby forming a 17-bit subcode word consisting of encoded nibbles $y_0$ to $y_3$.

12. A method according to claim 11 wherein said calculating step includes encoding the selected 8-bit input symbol pair C,D according to the rate 16/17 base code table shown below in which $$f_I = !(C[4i] + C[4i+1] + C[4i+2] + C[4i+3]), \text{ for } I=0, 1$$

and $$f_{i+2} = !(D[4i] + D[4i+1] + D[4i+2] + D[4i+3]), \text{ for } I=0, 1$$

where '+' is the logical OR operator and ! is the logical NOT operator and Z=Z[0:3]=0100

| $f_0$ | $f_1$ | $f_2$ | $f_3$ | $x_0$ | $x_1$ | $x_2$ | $x_3$ |
|---|---|---|---|---|---|---|---|
| 0 | 0 | 0 | 0 | C[0:3] | 0 C[4:7] | D[0:3] | D[4:7] |
| 0 | 0 | 0 | 1 | C[0:3] | 1 $f_0\,f_1\,f_2\,f_3$ | C[4:7] | D[0:3] |
| 0 | 0 | 1 | 0 | C[0:3] | 1 $f_0\,f_1\,f_2\,f_3$ | C[4:7] | D[4:7] |
| 0 | 1 | 0 | 0 | C[0:3] | 1 $f_0\,f_1\,f_2\,f_3$ | D[0:3] | D[4:7] |
| 1 | 0 | 0 | 0 | C[4:7] | 1 $f_0\,f_1\,f_2\,f_3$ | D[0:3] | D[4:7] |
| 0 | 0 | 1 | 1 | C[0:3] | 1 $f_0\,f_1\,f_2\,f_3$ | C[4:7] | Z |
| 0 | 1 | 0 | 1 | C[0:3] | 1 $f_0\,f_1\,f_2\,f_3$ | D[0:3] | Z |
| 1 | 0 | 0 | 1 | C[4:7] | 1 $f_0\,f_1\,f_2\,f_3$ | D[0:3] | Z |
| 0 | 1 | 1 | 0 | C[0:3] | 1 $f_0\,f_1\,f_2\,f_3$ | Z | D[4:7] |
| 1 | 0 | 1 | 0 | C[4:7] | 1 $f_0\,f_1\,f_2\,f_3$ | Z | D[4:7] |
| 1 | 1 | 0 | 0 | Z | 1 $f_0\,f_1\,f_2\,f_3$ | D[0:3] | D[4:7] |
| 0 | 1 | 1 | 1 | C[0:3] | 1 $f_0\,f_1\,f_2\,f_3$ | Z | Z |
| 1 | 0 | 1 | 1 | C[4:7] | 1 $f_0\,f_1\,f_2\,f_3$ | Z | Z |
| 1 | 1 | 0 | 1 | Z | 1 $f_0\,f_1\,f_2\,f_3$ | D[0:3] | Z |
| 1 | 1 | 1 | 0 | Z | 1 $f_0\,f_1\,f_2\,f_3$ | Z | D[4:7] |
| 1 | 1 | 1 | 1 | Z | 1 $f_0\,f_1\,f_2\,f_3$ | Z | Z |

13. A method of rate 32/33 encoding a 32-bit input sequence comprising the steps of:
receiving a series of four 8-bit input symbols;
selecting one of the series of input symbols for rate 8/9 encoding;
leaving the three non-selected 8-bit input symbols unencoded;
rate 8/9 encoding the selected input symbol so as to form a 9-bit subcode word comprising up to three nibbles; and
interleaving the three subcode nibbles among the three unencoded 8-bit input symbols, thereby forming a 33-bit codeword.

14. A method of rate 56/57 encoding a 56-bit input sequence comprising the steps of:
receiving a series of seven 8-bit input symbols;
selecting two of the series of input symbols for rate 16/17 encoding;
leaving the five non-selected 8-bit input symbols unencoded;
rate 16/17 encoding the selected two of the input symbols so as to form a 17-bit subcode word comprising up to five nibbles; and
interleaving up to five nibbles among the five unencoded 8-bit input symbols, thereby forming a 57-bit codeword.

15. A method of rate 56/57 encoding a 56-bit input sequence according to claim 14 wherein said nibbles and said unencoded symbols are arranged as follows 8 3 8 4 8 3 8 4 8 3, where each numeral 8 indicates one of the unencoded symbols and each numeral less than 8 indicates by number of bits one of the subcode word nibbles.

16. A method of rate 72/73 encoding a 72-bit input sequence comprising the steps of:
receiving a series of nine 8-bit input symbols;
selecting three of the series of input symbols for rate 24/25 encoding;
leaving the six non-selected 8-bit input symbols unencoded;
rate 24/25 encoding the selected three of the input symbols so as to form an 25-bit subcode word comprising up to six nibbles; and
interleaving the said up to six nibbles among the six unencoded input symbols, thereby forming a 73-bit codeword.

17. A method of rate 72/73 encoding a 72-bit input sequence according to claim 16 wherein said interleaving step consists of arranging the unencoded bytes and the subcode nibbles to form the 73-bit codeword as shown in the following table, in which each letter "A" indicates an arbitrary but unique one of the unencoded bytes and each letter "x" indicates an arbitrary but unique one of the encoded nibbles:

| 72/73 codeword arrangement | | | | | | | | | | | |
|---|---|---|---|---|---|---|---|---|---|---|---|
| A | x | A | x | A | x | A | x | A | x | A | x |

18. A method according to claim 17 wherein said interleaving step consists of arranging the unencoded bytes and the subcode nibbles as shown in the following table, in which each letter "A" indicates an arbitrary but unique one of the unencoded bytes and each letter "x" indicates an arbitrary but unique one of the encoded nibbles:

| 72/73 codeword arrangement | | | | | | | | | | | |
|---|---|---|---|---|---|---|---|---|---|---|---|
| x | A | x | A | x | A | x | A | x | A | x | A |

19. A method of rate 80/81 encoding an 80-bit input sequence comprising the steps of:
receiving a series of ten 8-bit input symbols;
selecting three of the series of input symbols for rate 24/25 encoding;
leaving the seven non-selected 8-bit input symbols unencoded;
rate 24/25 encoding the selected three of the input symbols so as to form an 25-bit subcode word comprising up to six nibbles; and
interleaving the said up to six nibbles among the seven unencoded input symbols, thereby forming a 81-bit codeword.

20. A method of rate 80/81 encoding a 80-bit input sequence according to claim 19 wherein said interleaving step consists of arranging the unencoded bytes and the subcode nibbles as shown in the following table, in which each letter "A" indicates an arbitrary but unique one of the unencoded bytes and each letter "x" indicates an arbitrary but unique one of the encoded nibbles:

| 80/81 codeword arrangement | | | | | | | | | | | | |
|---|---|---|---|---|---|---|---|---|---|---|---|---|
| A | x | A | x | A | x | A | x | A | x | A | x | A |

* * * * *

UNITED STATES PATENT AND TRADEMARK OFFICE
CERTIFICATE OF CORRECTION

PATENT NO. : 6,201,485 B1
DATED : March 13, 2001
INVENTOR(S) : McEwen et al.

Page 1 of 1

It is certified that error appears in the above-identified patent and that said Letters Patent is hereby corrected as shown below:

Column 12, claim 12,
Line 60, replace "I+0" with -- I=0 --.

Signed and Sealed this

Twelfth Day of March, 2002

Attest:

JAMES E. ROGAN
Attesting Officer
Director of the United States Patent and Trademark Office